United States Patent
Cheng

(10) Patent No.: US 10,965,314 B2
(45) Date of Patent: Mar. 30, 2021

(54) COMPENSATION TABLE COMPRESSION METHOD, DISPLAY MANUFACTURING APPARATUS, AND MEMORY

(71) Applicant: TCL China Star Optoelectronics Technology Co., Ltd., Guangdong (CN)

(72) Inventor: Lin Cheng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/616,490

(22) PCT Filed: Jul. 11, 2019

(86) PCT No.: PCT/CN2019/095550
§ 371 (c)(1),
(2) Date: Nov. 24, 2019

(87) PCT Pub. No.: WO2020/244022
PCT Pub. Date: Dec. 10, 2020

(65) Prior Publication Data
US 2020/0412377 A1    Dec. 31, 2020

(30) Foreign Application Priority Data

Jun. 3, 2019    (CN) .......................... 20191047572.2

(51) Int. Cl.
*H03M 7/30* (2006.01)
*G09G 3/3208* (2016.01)

(52) U.S. Cl.
CPC ............ *H03M 7/30* (2013.01); *G09G 3/3208* (2013.01); *G09G 2320/0233* (2013.01); *G09G 2320/0242* (2013.01); *G09G 2320/0285* (2013.01)

(58) Field of Classification Search
CPC ............ H03M 7/30; G09G 2320/0233; G09G 3/3208; G09G 2320/0285; G09G 2320/0242
(Continued)

(56) References Cited

U.S. PATENT DOCUMENTS 9,607,544 B2 * 3/2017 Lu ..................... G09G 3/3208
10,666,292 B2 * 5/2020 Deng .................. G09G 3/3208
(Continued)

FOREIGN PATENT DOCUMENTS

| CN | 102186070 A | 9/2011 |
| CN | 108172168 A | 6/2018 |

(Continued)

*Primary Examiner* — Khai M Nguyen

(57) ABSTRACT

The present invention discloses a compensation table compression method, a display manufacturing apparatus, and a memory. The method includes: obtaining a reference frame compensation table and a current frame compensation table; dividing the reference frame compensation table and the current frame compensation table into a plurality of coding blocks, wherein each coding block is separately processed by using multiple prediction modes to obtain a residual coding block in the corresponding prediction mode; and compressing the residual coding block. By using the above method, the invention can save resources, reduce costs, and improve work efficiency.

10 Claims, 4 Drawing Sheets

(58) Field of Classification Search
USPC .......................................................... 341/87
See application file for complete search history.

(56) References Cited

U.S. PATENT DOCUMENTS

2019/0200022 A1  6/2019  Deng et al.
2019/0289290 A1  9/2019  Kawamura et al.

FOREIGN PATENT DOCUMENTS

| CN | 109324778 A | 2/2019 |
| CN | 109741715 A | 5/2019 |
| JP | 2018082274 A | 5/2018 |

* cited by examiner

COMPENSATION TABLE COMPRESSION METHOD, DISPLAY MANUFACTURING APPARATUS, AND MEMORY

FIELD OF INVENTION

The present invention relates to the field of displays, and more particularly to a compensation table compression method, a display manufacturing device, and a memory.

BACKGROUND OF INVENTION

To eliminate a mura of a display, a compensation table is typically used to store compensation information for each pixel. When images are displayed, a driving board looks up a compensation table, adjusts signals, increases signals in dark areas of a panel, and decreases signals in over-bright areas to present a uniform display effect. In the compensation table, each pixel corresponds to a set of compensation information, and each set of compensation information includes one or more compensation data. The physical meaning of the compensation data depends on the algorithm, which is usually an adjustment value of a specific gray level, and there is also an algorithm to set it to the voltage value to be adjusted.

Technical Problem

The size of a compensation table is equal to the number of panel pixels multiplied by the size of each set of compensation information. As the size of the display panel is getting larger, the compensation table will occupy a large amount of system storage resources, which requires high hardware systems, and it takes time to transfer and burn data on the production line.

Technical Problem

In order to solve the above technical problem, a technical solution adopted by the present invention is to provide a compensation table compression method, comprising: obtaining a reference frame compensation table and a current frame compensation table; dividing the reference frame compensation table and the current frame compensation table into a plurality of coding blocks, wherein each coding block is separately processed by using multiple prediction modes to obtain a residual coding block in the corresponding prediction mode; and compressing the residual coding block.

Beneficial Effect

The beneficial effects of the present invention are: different from the prior art, the present invention combines various prediction modes to make the residual matrix closer to 0, which is more conducive to compression. The display compensation table has the largest proportion of compression under lossless conditions, reducing the occupation of memory space, saving system hardware resources, reducing costs, reducing the time spent transmitting and burning data, and improving work efficiency.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The technical solutions in the embodiments of the present invention are clearly and completely described in the following with reference to the accompanying drawings in the embodiments of the present invention. Obviously, the described embodiments are only a part of the embodiments of the present invention, and not all of the embodiments. Based on the embodiments in the present invention, all other embodiments obtained by those skilled in the art without creative efforts are within the scope of the present invention.

Figure 1:
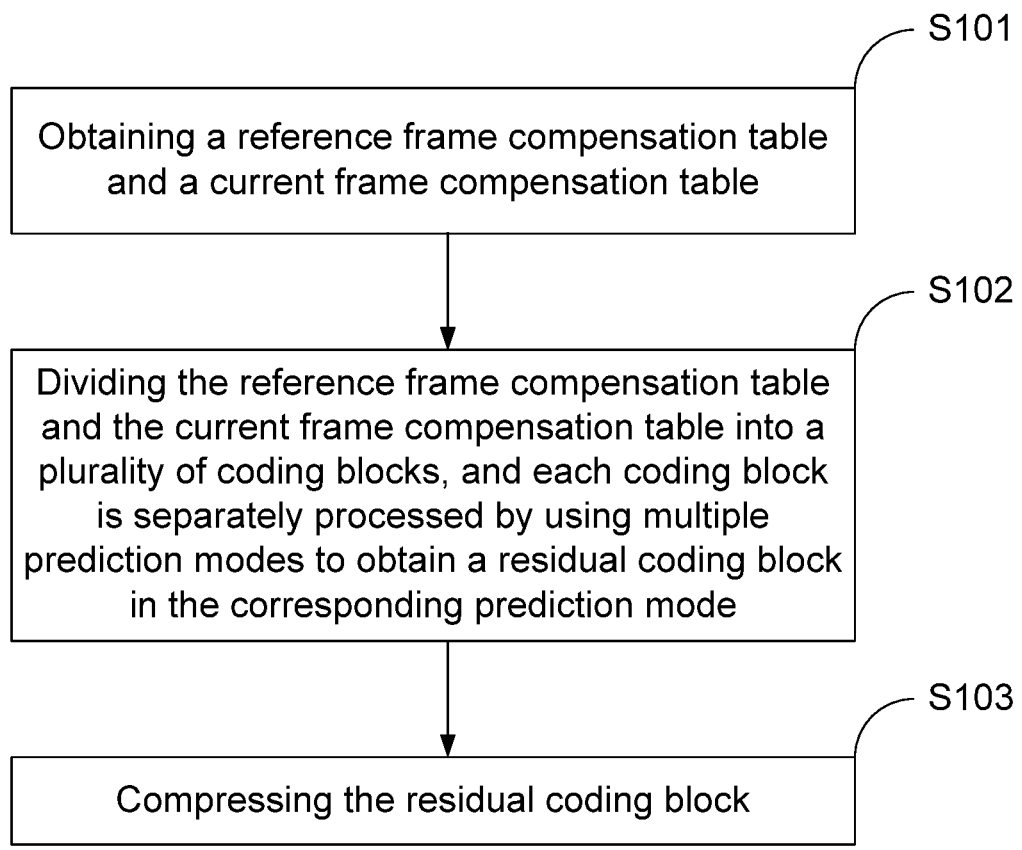
FIG. 1 is a schematic flow chart according to a first embodiment of a compensation table compression method provided by the present invention.

Please refer to FIG. 1. FIG. 1 is a schematic flow chart according to a first embodiment of a compensation table compression method provided by the present invention. The compensation table compression method provided by the present invention comprises:

Step S101: Obtaining a reference frame compensation table and a current frame compensation table.

In a specific implementation scenario, an organic light emitting diode (OLED) display panel has a compensation table with m kinds of colors and n kinds of gray scale, and thus the OLED display panel has a m*n sheet compensation table. When the compensation table in the OLED display panel is compressed, the compensation table in the OLED display panel may be arranged into a multi-frame compensation table according to different colors and different gray scales for compression.

In the implementation scenario, when compressing 24 compensation tables in an OLED display panel having 4 colors and 6 gray scales, 24 compensation tables can be divided into 4 groups of compensation tables according to different colors, and each set of compensation tables is divided into 6 frame compensation tables according to different gray scales, thereby obtaining a 24-frames compensation table arranged in sequence. Select one frame compensation table as the reference frame compensation table in the 24-frames compensation table, and use the other 23-frames compensation table as the current frame compensation table. In other implementation scenarios, the reference frame compensation table is a frame compensation table prepared in advance by the user, and the 24-frames compensation table is sequentially used as the current frame compensation table.

In other implementation scenarios, m and n may take other values, or may be arranged according to other properties of the compensation table.

Step S102: Dividing the reference frame compensation table and the current frame compensation table into a plurality of coding blocks, and each coding block is separately processed by using multiple prediction modes to obtain a residual coding block in the corresponding prediction mode.

In a specific implementation scenario, each frame compensation table is divided into multiple coding blocks, and each coding block is separately processed by using multiple prediction modes to obtain a residual coding block in the corresponding prediction mode. Specifically, the multiple prediction modes may comprise: an inter-prediction and an intra-prediction. It should be noted that those skilled in the art can introduce other prediction modes to process each coding block as needed, and the purpose of this invention is to emphasize that when compressing the compensation table, each coding block is processed by multiple prediction modes to improve compression quality.

In this implementation scenario, an intra-prediction is first used, the first coding block in the current frame is unchanged, and other coding blocks are subtracted from the first coding block to obtain residual coding blocks of the intra-prediction. Then, an inter-prediction is performed, and all the coding blocks in the current frame are subtracted from the coding blocks corresponding to the reference frame, for example, the first coding block in the current frame is subtracted from the first coding block in the reference frame to residual coding blocks of the inter-prediction. Thus, the residual matrix is closer to zero, which is more conducive to compression.

Step S103: Compressing the residual coding block.

In a specific implementation scenario, the residual coding block is compressed by scanning, numerical scaling, and entropy coding. In other implementation scenarios, the residual coding block is compressed by using at least one of scanning, numerical scaling, and entropy coding.

In the implementation scenario, the residual coding block is a residual coding block of the inter-prediction. In other implementation scenarios, the residual coding block is a residual coding block corresponding to the selected prediction mode.

It can be seen from the above description that in the embodiment, by processing the coding blocks in the compensation table by using the multiple prediction modes, the residual matrix can be made closer to 0, which is more conducive to compression. The display compensation table has the largest proportion of compression under lossless conditions, reducing the occupation of memory space, saving system hardware resources, reducing costs, reducing the time spent transmitting and burning data, and improving work efficiency.

Figure 2:
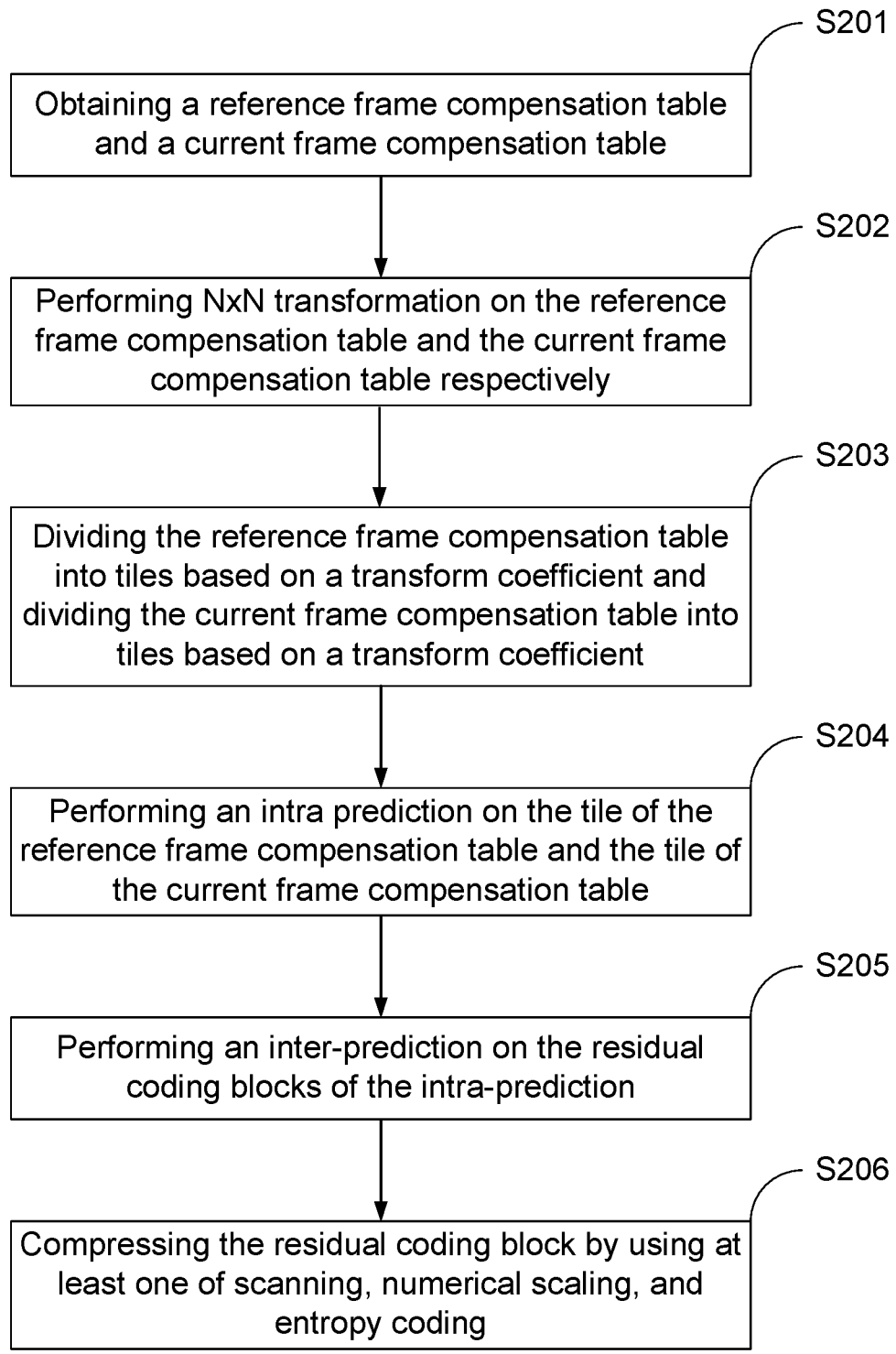
FIG. 2 is a schematic flow chart according to a second embodiment of a compensation table compression method provided by the present invention.

Please refer to FIG. 2. FIG. 2 is a schematic flow chart according to a second embodiment of a compensation table compression method provided by the present invention. The compensation table compression method provided by the present invention comprises:

Step S201: Obtaining a reference frame compensation table and a current frame compensation table.

In a specific implementation scenario, this step is basically the same as step S101 in the first embodiment of the compensation table compression method provided by the present invention, and details are not described herein.

Step S202: Performing N×N transformation on the reference frame compensation table and the current frame compensation table respectively.

Figure 3:
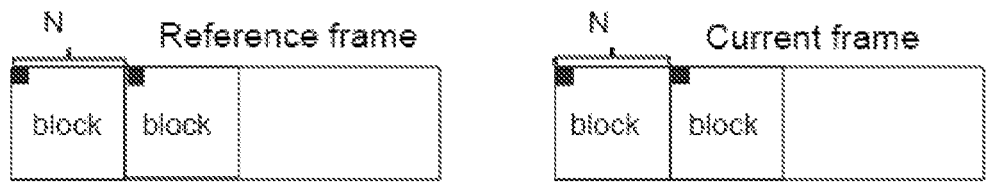
FIG. 3 is a schematic structural diagram of transforming a reference frame compensation table and a current frame compensation table in the compensation table compression method provided by the present invention.

In a specific implementation scenario, N is 16. After the 16×16 transform is performed by the reference frame compensation table and the current frame compensation table, the energy is concentrated in the upper left corner of the coding block. Referring to FIG. 3, FIG. 3 is a schematic structural diagram of transforming the reference frame compensation table and the current frame compensation table in the compensation table compression method provided by the present invention. As shown in FIG. 3, the energy is concentrated in the small black squares shown in the figure.

Step S203: Dividing the reference frame compensation table into tiles based on a transform coefficient and dividing the current frame compensation table into tiles based on a transform coefficient.

In a specific implementation scenario, a transform coefficient of the reference frame compensation table and a transform coefficient of the current frame compensation table are respectively divided into tiles. In this implementation scenario, the size of the reference frame compensation table and the current frame compensation table are 1080*1920, and the transform coefficient N is 16. Therefore, each tile size is 16*1920. Implement coding and decoding functions with tiles as the basic unit.

Step S204: Performing an intra-prediction on the tile of the reference frame compensation table and the tile of the current frame compensation table.

Figure 4:
FIG. 4 is a schematic structural diagram of performing an intra-prediction on the reference frame compensation table and the current frame compensation table in the compensation table compression method provided by the present invention.

In a specific implementation scenario, the tile of the reference frame compensation table and the tile of the current frame compensation table are divided into multiple coding blocks, and the coding blocks are used as basic units for the intra-prediction. That is, the first coding block in one tile is unchanged, and the other coding blocks are subtracted from the first coding block to obtain a residual coding block for the intra-prediction. Referring to FIG. 4. FIG. 4 is a schematic structural diagram after performing the intra-prediction on the reference frame compensation table and the current frame compensation table in the compensation table compression method provided by the present invention.

Step S205: Performing an inter-prediction on the residual coding blocks of the intra-prediction.

In a specific implementation scenario, the inter-prediction is performed on the residual coding blocks after the intra-prediction of the current frame compensation table is completed. Specifically, according to the residual coding blocks of the intra-prediction in the reference frame compensation table, using a normal or least squares method for the inter-prediction.

In this implementation scenario, a conventional inter-prediction is used for the first coding block in the current frame compensation table tile, and other coding blocks may use the inter-prediction method of the normal or least square method. When the conventional inter-prediction is used, the reference block of the conventional inter-prediction of the coding block in the current frame compensation table is obtained according to the coding block corresponding to the reference frame compensation table. Subtracting the coded block in the current frame compensation table from the obtained reference block to obtain the residual coding block of the inter-prediction.

Figure 5:
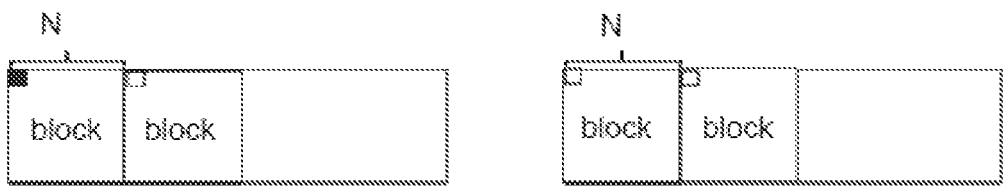
FIG. 5 is a schematic structural diagram of performing an inter-prediction on the reference frame compensation table and the current frame compensation table in the compensation table compression method provided by the present invention.

When the least squares inter-prediction is used, the linear relationship between the coding block in the current frame compensation table and the corresponding coding block, the left coding block in the reference frame compensation table is calculated. Obtaining a reference block of the least squares inter-prediction in the current coding block according to the reference block corresponding to the reference frame compensation table, subtracting the coding block in the current frame compensation table from the obtained reference block, and obtaining a residual coding block of the inter-prediction. Referring to FIG. 5. FIG. 5 is a schematic structural diagram of performing an inter-prediction on the reference frame compensation table and the current frame compensation table in the compensation table compression method provided by the present invention.

Step S206: Compressing the residual coding block by using at least one of scanning, numerical scaling, and entropy coding.

In a specific implementation scenario, this step is basically the same as step S103 in the first embodiment of the compensation table compression method provided by the present invention, and details are not described herein.

It can be seen from the above description that in the embodiment, by combining the inter-prediction and the intra-prediction to process the coding block in the compensation table, the residual matrix can be made closer to 0, which is more conducive to compression. The display compensation table has the largest proportion of compression under lossless conditions, reducing the occupation of memory space, saving system hardware resources, reducing costs, reducing the time spent transmitting and burning data, and improving work efficiency.

Figure 6:
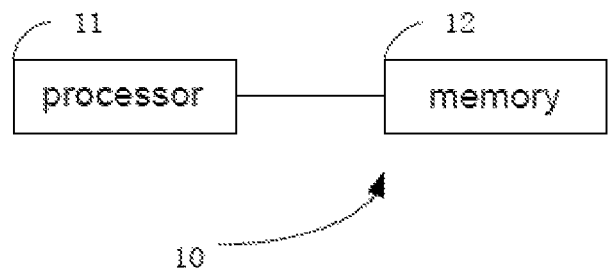
FIG. 6 is a schematic structural diagram according to an embodiment of a display manufacturing device provided by the present invention.

FIG. 6 is a schematic structural diagram of an embodiment of a display manufacturing device provided by the present invention. The display manufacturing device 10 comprises a processor 11 and a memory 12. The memory 12 is used to store program instructions, and the processor 11 is configured to execute program instructions in the memory 12 to implement the method described in any of the above embodiments. In one implementation scenario, the memory 12 comprises a non-volatile storage portion for storing the program instructions. The processor 21 controls the memory 22 to implement the method in any of the above embodiments.

The processor 11 may also be referred to as a central processing unit (CPU). The processor 11 may be an integrated circuit chip with signal processing capabilities. The processor 11 can also be a general processor, a digital signal processor (DSP), an application specific integrated circuit (ASIC), an off-the-shelf programmable gate array (FPGA) or other programmable logic device, discrete gate or transistor logic device, discrete hardware component. The general processor may be a microprocessor or the processor or any conventional processor or the like. In addition, the processor 11 can be implemented by a plurality of circuit chips.

In this implementation scenario, the processor 11 obtains a reference frame compensation table and a current frame compensation table; divides the reference frame compensation table and the current frame compensation table into a plurality of coding blocks, and performs a plurality of prediction modes for each coding block respectively to obtain a residual coding block corresponding to the corresponding prediction mode, and finally compressing the residual coding block.

It can be seen from the above description that the display manufacturing device in this embodiment can process the coding block in the compensation table by combining the inter-prediction and the intra-prediction, so that the residual matrix can be closer to 0, which is more conducive to compression. The display compensation table has the largest proportion of compression under lossless conditions, reducing the occupation of memory space, saving system hardware resources, reducing costs, reducing the time spent transmitting and burning data, and improving work efficiency.

Figure 7:
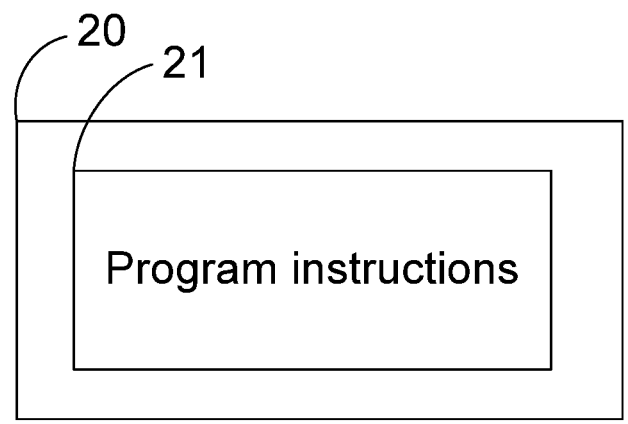
FIG. 7 is a schematic structural diagram of according to an embodiment of a memory provided by the present invention.

Please refer to FIG. 7. FIG. 7 is a schematic structural diagram of according to an embodiment of a memory provided by the present invention. The memory 20 stores at least one program instruction 21 for executing the method as shown in FIG. 1 or FIG. 2. In one embodiment, the memory 30 may be a memory chip in the terminal, a hard disk, or a portable hard disk or other readable and writable storage tool such as a USB flash drive or an optical disk, or may be a server or the like.

It can be seen from the above description that the program instructions stored in the memory in this embodiment can be used to combine the inter-prediction and the intra-prediction to process the coding block in the compensation table, so that the residual matrix can be closer to 0, which is more conducive to compression. The display compensation table has the largest proportion of compression under lossless conditions, reducing the occupation of memory space, saving system hardware resources, reducing costs, reducing the time spent transmitting and burning data, and improving work efficiency.

Different from the prior art, the present invention can make the residual matrix closer to 0 by combining the multiple prediction modes to process the coding block in the compensation table, which is more conducive to compression. The display compensation table has the largest proportion of compression under lossless conditions, reducing the occupation of memory space, saving system hardware resources, reducing costs, reducing the time spent transmitting and burning data, and improving work efficiency.

In the above, various other corresponding changes and modifications can be made according to the technical solutions and technical ideas of the present invention to those skilled in the art, and all such changes and modifications are within the scope of the claims of the present invention.

What is claimed is:

1. A compensation table compression method, comprising:
   obtaining a reference frame compensation table and a current frame compensation table;
   dividing the reference frame compensation table and the current frame compensation table into a plurality of coding blocks, wherein each coding block is separately processed using multiple prediction modes to obtain a residual coding block in the corresponding prediction mode; and
   compressing the residual coding block.

2. The method as claimed in claim 1, wherein the prediction modes comprise an inter-prediction and an intra-prediction.

3. The method as claimed in claim 2, wherein in the step of each coding blocks is separately processed by using the multiple prediction modes to obtain the residual coding block in the corresponding prediction mode, the method comprises:

performing an intra-prediction on the coding blocks of the reference frame compensation table and the coding blocks of the current frame compensation table, and obtaining residual coding blocks of the intra-prediction; and performing an inter-prediction on the obtained residual coding blocks after the intra-prediction is performed, and obtaining residual coding blocks of the inter-prediction.

4. The method as claimed in claim 3, wherein in the step of performing the inter-prediction on the obtained residual coding blocks after the intra-prediction is performed, the method comprises:

referring to the residual coding blocks of the intra-prediction of the reference frame compensation table, and using a normal or least squares method for the inter-prediction.

5. The method as claimed in claim 4, wherein before the step of dividing the reference frame compensation table and the current frame compensation table into the coding blocks, the method comprises:

performing N×N transformation on the reference frame compensation table and the current frame compensation table respectively; and dividing the reference frame compensation table into tiles based on a transform coefficient N and dividing the current frame compensation table into tiles based on a transform coefficient N.

6. The method as claimed in claim 5, wherein in the step of referring to the residual coding blocks of the intra-prediction of a previous frame, and using a normal or least squares method for the inter-prediction, the method comprises:

performing the normal method for the inter-prediction on a first coding block of the titles of the current frame compensation table, and performing the normal or least squares method for the inter-prediction for other coding blocks of the titles of the current frame compensation table.

7. The method as claimed in claim 5, wherein the step of performing the intra-prediction for each of the coding blocks comprises:

performing an intra-prediction on code partitions of the reference frame compensation table and code partitions of the current frame compensation table.

8. The method as claimed in claim 1, wherein the step of compressing the residual coding block comprises:

compressing the residual coding block by using at least one of scanning, numerical scaling, and entropy coding.

9. A display manufacturing apparatus, comprising: a processor, and a memory and a connecting circuit coupled to the processor, wherein the memory stores program instructions, and the processor executes the program instructions for implementing the method as claimed in claim 1.

10. A memory in which program instructions are stored, the program instructions are executed to implement following steps:

obtaining a reference frame compensation table and a current frame compensation table;

dividing the reference frame compensation table and the current frame compensation table into a plurality of coding blocks, wherein each coding block is separately processed by using multiple prediction modes to obtain a residual coding block in the corresponding prediction mode; and compressing the residual coding block.

* * * * *